United States Patent [19]

Dancker et al.

[11] Patent Number: 4,622,668
[45] Date of Patent: Nov. 11, 1986

[54] PROCESS AND APPARATUS FOR TESTING A MICROPROCESSOR AND DYNAMIC RAM

[75] Inventors: Gregory A. Dancker, Rochester; Edwin C. Grazier, Stewartville, both of Minn.

[73] Assignee: International Business Machines Corporation, Armonk, N.Y.

[21] Appl. No.: 608,655

[22] Filed: May 9, 1984

[51] Int. Cl.[4] ............................................. G06F 11/00
[52] U.S. Cl. ........................................ 371/20; 371/21; 365/222
[58] Field of Search ................... 371/21, 20, 10, 27, 371/25; 364/200, 900; 365/233, 201, 222, 200, 230, 149

[56] References Cited

U.S. PATENT DOCUMENTS

| | | | |
|---|---|---|---|
| 4,134,150 | 6/1979 | Shiga | 365/222 |
| 4,203,159 | 5/1980 | Wanlass | 365/222 |
| 4,287,594 | 9/1981 | Shirasaka | 371/27 |
| 4,333,167 | 6/1982 | McElroy | 365/222 |
| 4,334,295 | 6/1982 | Nagami | 365/222 |
| 4,339,766 | 7/1982 | Rao | 365/149 |
| 4,355,376 | 10/1986 | Gould | 371/60 |
| 4,369,511 | 1/1983 | Kimura | 371/27 |
| 4,388,719 | 6/1983 | Soltysik | 371/27 |
| 4,402,081 | 8/1983 | Ichimiya | 371/27 |
| 4,451,918 | 5/1984 | Gillette | 371/27 |
| 4,460,998 | 7/1984 | Yamada | 371/10 |
| 4,468,759 | 8/1984 | Kung et al. | 365/201 |
| 4,495,603 | 1/1985 | Vorshney | 365/201 |
| 4,519,078 | 5/1985 | Komonytsky | 371/27 |

*Primary Examiner*—Michael R. Fleming
*Attorney, Agent, or Firm*—Hugh D. Jaeger

[57] ABSTRACT

Process and apparatus for testing a microprocessor and dynamic RAM by a single tester where the microprocessor and dynamic RAM may be on a single card. The process makes the RAM appear static to an external static tester by separate read/write and refresh logic for the RAM. Two different clock generators connect to logic where each clock is selectively connectable to an on-board oscillator or to an external input. Priority logic for gating the refresh logic within a predetermined interval and gating the read/write logic at other times. The process includes three steps of a static logic test, a memory interface test, and, a functional test of the logic and the dynamic RAM. The third step is accomplished by executing a program in the on-card microprocessor. The three steps of the test form a single set of test data.

14 Claims, 4 Drawing Figures

PROCESS AND APPARATUS FOR TESTING A MICROPROCESSOR AND DYNAMIC RAM

TECHNICAL FIELD

This invention relates to process and apparatus for testing a microprocessor such as a 16 bit microprocessor and a dynamic RAM such as 128K bytes as an example, especially where the microprocessor and dynamic RAM are on a single card. The test procedure is divided into three steps; (1) static logic test, (2) memory interface test, and (3) a functional test of the logic and the dynamic RAM. Step three of the test is accomplished by executing a program in the microprocessor.

BACKGROUND ART

Prior art testers for single-board microprocessor-based controllers having on-board dynamic RAM has required two separate testers, a static tester for the logic and a dynamic tester for the RAM, and has required all RAM data, address and control lines to be brought out to tab pins of the card.

Logic and dynamic RAM has been packaged on a single card. It usually has been a design constraint of being able to electrically isolate the RAM from the logic, and to make all RAM control, address, and data lines available at card I/O's. This has been necessary to accommodate unit testing. Prior art tests have required the use of a static logic tester for the logic and a separate specialized memory tester for the RAM. Two different testers resulted in lost motion thereby increasing unit costs and decreasing manufacturing throughput. Product suffered in that, among other reasons, separate testers were required, and static and functional speed testing did not occur simultaneously. Also, the prior art devices did not provide a self test program with any type of diagnostic capability which isolated to a failing component for AC faults.

The present invention overcomes the disadvantages of the prior art by making a dynamic RAM appear like a static device to an external static tester.

DISCLOSURE OF THE INVENTION

The test for testing the microprocessor and dynamic RAM such as where the microprocessor and dynamic RAM are on a single card comprises three steps; a first step for testing the logic; a second step for testing memory interface; and, a third step for functionally testing logic and the dynamic RAM by executing a program in the on-card microprocessor. The first step of the test procedure involves testing of the logic and the static array within the unit. This test is accomplished by applying a set of patterns to the unit which check for faults within the micro logic blocks. With the exception of the memory interface logic and the dynamic RAM, this part of the test guarantees the absence of DC faults in the logic system. The second step of the test checks interface between the memory control logic and dynamic RAM. This interface includes address, data, and control lines associated with a RAM. Since the RAM is not isolated on the card, the RAM is included as part of the test path. In using a static logic tester for testing a data path containing a dynamic RAM, the RAM refresh function must be performed independent of the tester. The functions for making the dynamic RAM appear to the tester as a static device are as follows. A first function of a separate read/write control logic and refresh control logic for the RAM so each can be driven by an independent pair of clocks. A second function includes clock generation logic which provides two pairs of clocks; each pair having the capability of being driven from either the on-card oscillator or from input to the card. A third function includes synchronization and priority circuits within the storage control logic which manage the contention for the interface lines to the RAM so that there is no overlap between the read/write and refresh operation. A fourth function includes insuring that the minimum refresh interval of the dynamic RAM is met. The third step of the test procedure is a self-test program executed in the on-card microprocessor. This program functionally tests the card logic plus the complete RAM address space. Initial program load is performed by the static tester. The program instructions are incorporated in the test patterns which are loaded into the RAM using the same step developed for testing the memory interface. The testing which has been performed on the card includes a complete DC test of the logic at the micro logic block level, functional testing of the logic at the normal system operating speeds and functional tests of the complete dynamic RAM address space again at normal system operating speeds.

One significant aspect and feature of the present invention is that the process of the present invention provides a procedure for testing a unit such as a card containing a microprocessor and dynamic RAM on a single tester. By testing the card on one tester, the manufacturing throughput is increased while units costs are lowered; likewise, improved quality is achieved because the card experiences both static and functional speed testing.

Another significant aspect and feature of the present invention is that the processor testing can be performed on a standard manufacturing tester and no special RAM testers are required. The process includes a self-test program which provides diagnostic capability which isolates a failing component for AC faults.

A further significant aspect and feature of the present invention is that the storage interface makes the dynamic RAM appear to the tester like a static device.

DESCRIPTION OF THE INVENTION

The first step of the test involves testing of the logic and the static array. This test is accomplished by applying a set of patterns which check for faults within the micro logic blocks. With the exception of the memory interface logic and the dynamic RAM, this part of the test guarantees the absence of DC faults in the logic system. While static logic testing is not unique, it is the first step of the test procedure.

The second step of the test checks the interface between the memory control logic and the dynamic RAM. This interface includes address, data, and control lines associated with the RAM. Since a RAM is not isolated on a card which contains a microprocessor, the RAM is included as part of the test. In using a static logic tester for testing a data path containing a dynamic RAM, the RAM refresh function must be performed independent of the tester. The problem of refreshing the RAM was solved by certain functions which make the dynamic RAM appear to the tester like a static device. These functions are now set forth:

1. Separate read/write control logic and refresh control logic for RAM where each can be driven by an independent pair of clocks.
2. Clock generation logic which provides two pairs of clocks; each clock pair including the capability of being driven from either the on-card oscillator or from inputs to the card.
3. Synchronization and priority circuits within the storage control logic which manage the contention for the interface lines to the RAM such that there is no overlap between read/write and refresh operations.
4. Insuring that the minimum refresh interval of the dynamic RAM is met.

Figure 1:
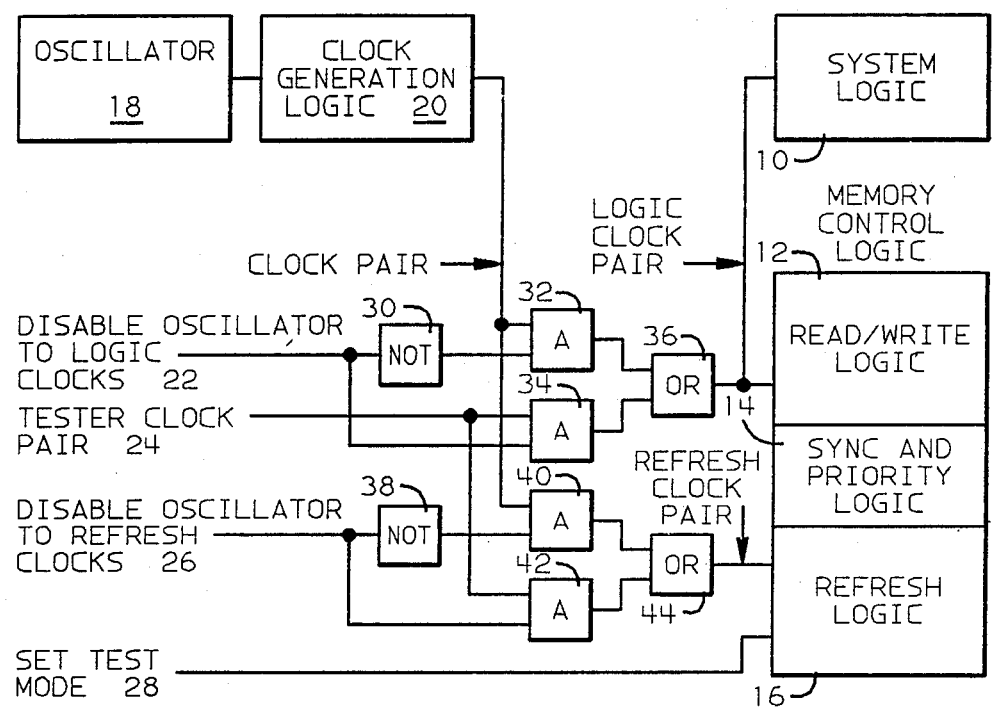
FIG. 1 illustrates a block diagram of the clock generation logic.

FIG. 1 illustrates a block diagram of clock generation logic. Two pairs of clocks are connected to the memory control logic. One pair, line labeled as logic clock pair, is connected to the read/write logic 12, as well as the system logic 10. A second pair, line labeled refresh clock pair, is connected to the refresh logic 16. Both clock pairs can be driven by a tester through inputs such as card test points to a card or by an on-card oscillator to either the logic clock pair or the refresh clock pair. When either of these disable lines 22 or 26 are active, the tester clock pair line 24 is enabled. For this step of the test, disable oscillator to logic clocks, line 22 is set active and disable oscillator to refresh clocks, line 26 is inactive. The logic which manages the refresh function of the memory is driven by the on-card oscillator 18 while the tester controls the clocks to the read/write function. The logic clock pair signal is generated thru logic 30-36 and the refresh clock pair is generated thru logic 38-44.

Synchronization and priority logic 14 is situated between the read/write 12 and refresh logic 16. This function synchronizes stimulus from the tester to the on-card refresh clocks and insures that the tester has priority over a refresh operation. This priority is required since both read/write and refresh operations utilize common RAM control lines. When the tester initiates a read/write operation, the priority logic disables the start of any new refresh cycles. Refresh operations already in progress at this time are provided with enough time to complete by delays provided in the test patterns. At the end of a read/write operation, refresh cycles are again enabled.

A timer within the refresh logic controls the rate at which refresh cycles occur. This timer is provided with the feature that the refresh rate can be changed from a normal rate to a test rate by changing the state of a set test mode line 28. During the memory interface test, the test refresh rate is in effect. This insures that enough refresh cycles occur between tester controlled read/write cycles to satisfy the refresh requirements of the dynamic RAM. The test patterns utilized in the second step of the test perform read/write operations to selected memory addresses which test all address, data, and control lines within the RAM interface at a '1' and a '0'. During read operations, data stays valid long enough so that the output can be strobed with the static tester.

Figure 2:
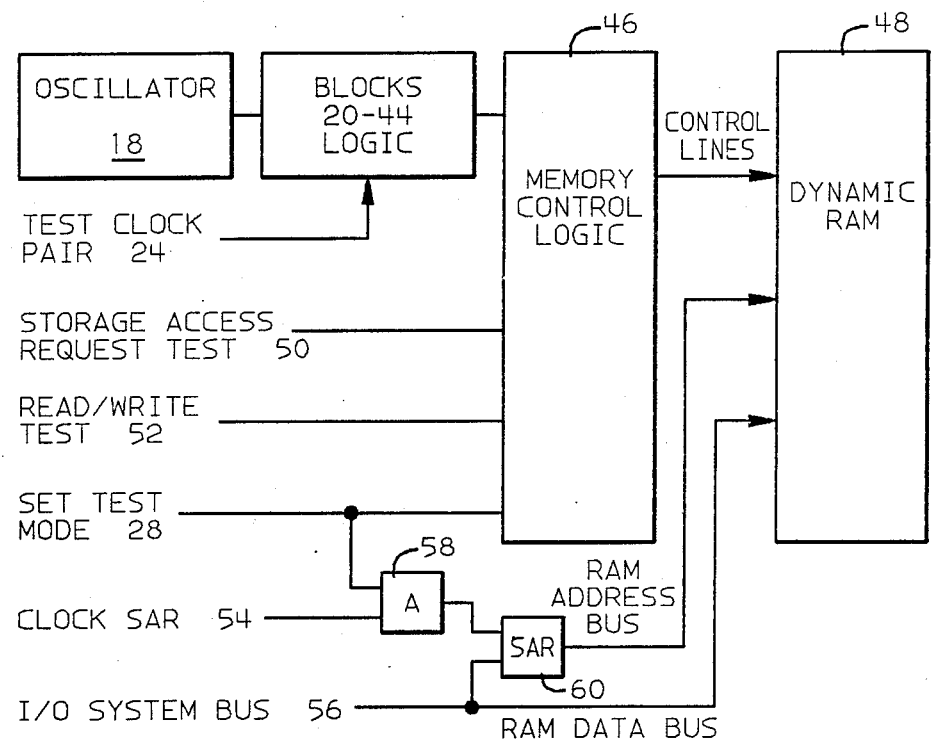
FIG. 2 illustrates a block diagram of a memory control logic and dynamic RAM under test.

FIG. 2 illustrates a block diagram of a memory control logic 46 and dynamic RAM 48 during the second step of the test. A set test mode line 28 of FIG. 1 enables the logic that is used for testing the RAM. An I/O System Bus 56 which is bi-directional provides a direct path between the tester and line labeled RAM data bus. This same bus is utilized to load the RAM address into Storage Address Register (SAR) 60. A clock SAR line 54 is utilized to latch the address into the SAR 60. A read/write test line 52 is utilized by the tester to initiate a read or write operation. The memory control logic 46 includes that of the read/write logic 12, sync and priority logic 14 and refresh logic 16 of FIG. 1.

Figure 3:
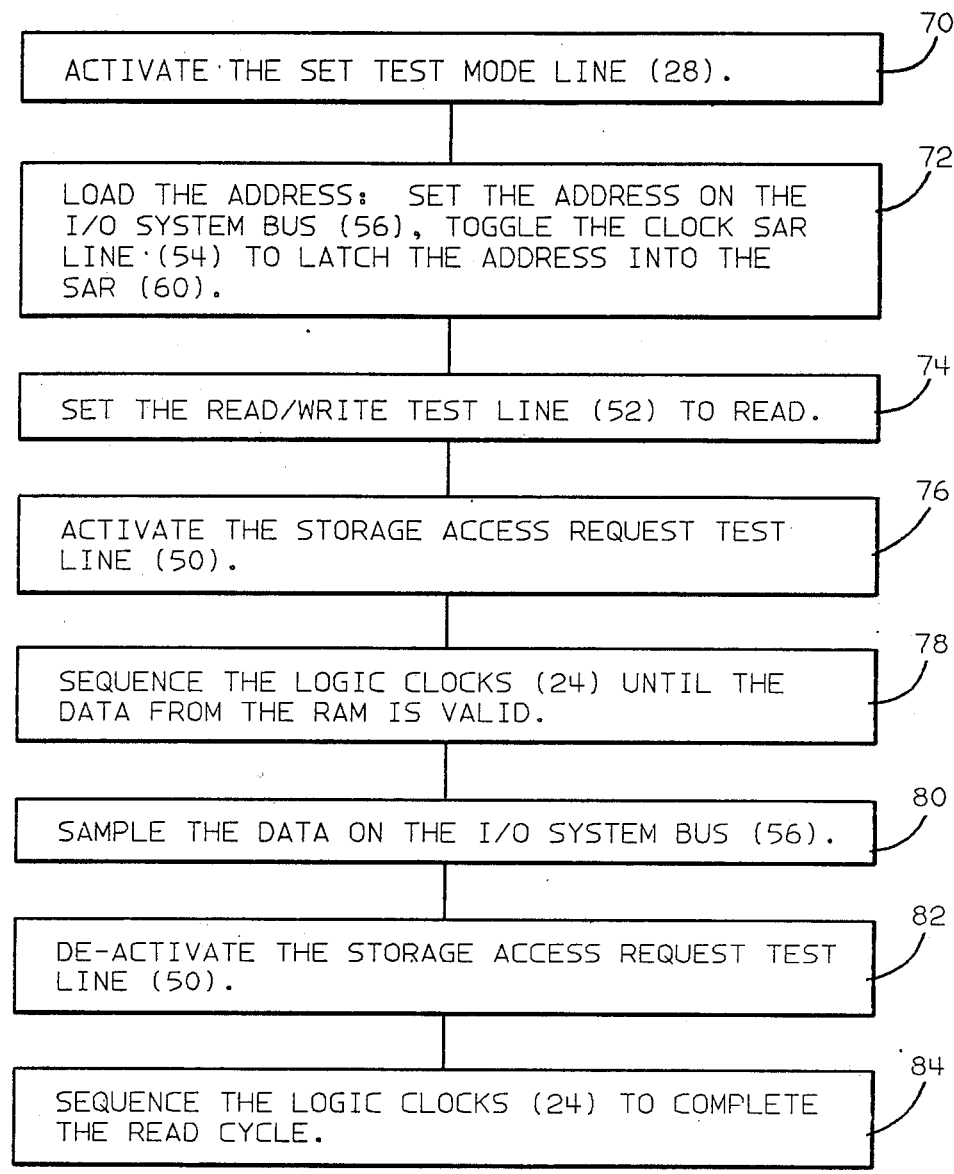
FIG. 3 illustrates a flow chart of a read test sequence.

FIG. 3 illustrates a flow chart for a test sequence for a read operation. The description is set forth in blocks 70-84 of the flow chart.

Figure 4:
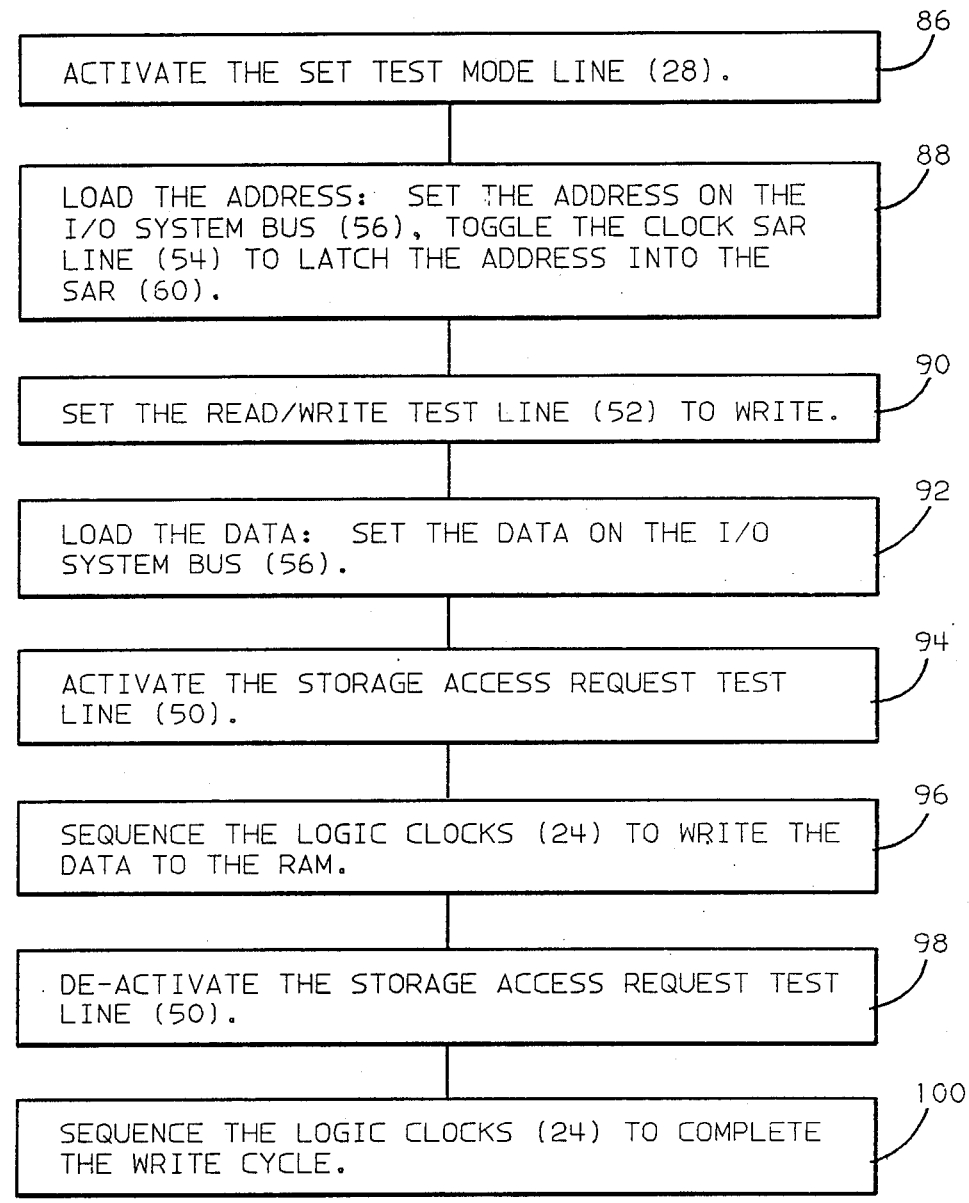
FIG. 4 illustrates a write test sequence.

FIG. 4 illustrates a flow chart for a test sequence for a write operation. The description is set forth in blocks 86-100 of the flow chart.

The third step of the test is a self-test program executed in the on-card microprocessor. This program functionally tests the card logic plus the complete RAM address space. Initial program load is performed by the static logic tester. The program instructions are incorporated into test patterns which are loaded into the RAM using the same steps for testing the memory interface. The test sequence as defined for a write operation in FIG. 4 is repeated for each instruction address. Following the program load, the tester resets the microprocessor, enables the on-card oscillator to drive both pairs of system clocks, and applies stimulus to card inputs which start the microprocessor. The tester then enters a wait loop for a fixed interval of time. The length of the interval is determined by the time required by the microprocessor to execute the self-test program. The microprocessor executes instructions at normal system operating speeds, independent of the tester. The self-test program is structured to record the test status within a hardware register. The state of the registers is updated following the completion of each phase of the selftest. The status is set to indicate "test complete—OK" when the program ends successfully. If a recoverable hardware error is detected by the program, the final state loaded into the register contains information which identifies the component or components which caused the error. In the event of a nonrecoverable error, which causes the microprocessor to stop, the current status in this register indicates the test phase in which the error occurred. This information can be utilized when determining the failing component. At the end of the tester wait loop, a final set of patterns is applied to the card which retrieves the self-test status from the hardware register. Since the static tester is capable of measuring only "1"s and "0"s, at card outputs, the data output for this pattern are set to expect a "test complete—OK" status. Any error during the self-test will be reflected as a DC logic failure at a card output. In the event of a card failure, the self-test status can be determined from the failing card outputs, and can be utilized in card repair diagnostics.

We claim:

1. Test system for a dynamic RAM and microprocessor including memory control logic, said test system comprising:
   a. refresh means for refreshing a dynamic RAM, said refreshing means including separate independent clocks;

b. control means for controlling readwrite cycles in said dynamic RAM while said refresh means controls refresh cycles; and, c. synchronization means and priority means for synchronizing stimulus to said separate independent clocks and insuring priority of said controlling means over said refresh means whereby said dynamic RAM appears static.

2. Test system of claim 1 comprising an oscillator for driving said separate clocks.

3. Test system of claim 1 wherein said control means further comprises means for checking interface between said memory control logic and said dynamic RAM.

4. Test system of claim 1 wherein said control means includes means for non-overlapping between said refresh cycles and refreshing said memory control logic.

5. Test system for a unit card including a dynamic RAM and a microprocessor, said test system comprising:

a. static logic means for applying a set of test patterns to said unit card including said dynamic RAM and said microprocessor;

b. memory interface means for checking interface between memory control logic means and said dynamic RAM, and including synchronization means and priority logic means connected between a read/write means and a refresh means of said memory control logic means; and, c. executing means for a self-test program logic of said unit card and address space of said dynamic RAM.

6. System of claim 5 comprising two distinct independent pair of clock generators connected to each of said read/write means, said synchronization means and said priority mean, and said refresh means.

7. System of claim 6 wherein each clock is selectively connectable to a card oscillator or to an external input.

8. System of claim 7 comprising priority gating means for said refresh means for gating within predetermined time intervals and for gating said read/write means at other times.

9. System of claim 8 comprising means for a minimum refresh interval of said dynamic RAM.

10. Process for testing a dynamic RAM and microprocessor comprising the steps of:

a. applying a set of test patterns and providing said test patterns in a dynamic RAM and a microprocessor for checking for static logic faults within micro logic blocks of said dynamic RAM and said microprocessor;

b. checking memory interface between memory control logic including read/write logic, synchronization and priority logic and refresh logic of said microprocessor and said dynamic RAM including address interface lines, data interface lines and control interface lines of said RAM, whereby said dynamic RAM appears static; and, c. executing a functional self-test program in said microprocessor.

11. Process of claim 10 comprising steps of driving, by independent pair of clocks, separate read/write control logic and refresh control logic for said dynamic RAM.

12. Process of claim 11 wherein each pair of clocks is driven by an oscillator on a card supporting said dynamic RAM and said microprocessor.

13. Process of claim 12 wherein each pair of clocks is driven by inputs to said card supporting said dynamic RAM and said microprocessor.

14. Process of claim 10 comprising the step of prioritizing the contention for interfacing lines providing no overlap between read/write operations and refresh operations of said dynamic RAM.

* * * * *